United States Patent
Alian et al.

(10) Patent No.: US 10,608,085 B2
(45) Date of Patent: Mar. 31, 2020

(54) TWO DIMENSIONAL FIELD EFFECT TRANSISTORS

(71) Applicant: IMEC VZW, Leuven (BE)

(72) Inventors: AliReza Alian, Heverlee (BE); Salim El Kazzi, Etterbeek (BE)

(73) Assignee: IMEC vzw, Leuven (BE)

( * ) Notice: Subject to any disclaimer, the term of this patent is extended or adjusted under 35 U.S.C. 154(b) by 10 days.

(21) Appl. No.: 15/829,753

(22) Filed: Dec. 1, 2017

(65) Prior Publication Data

US 2018/0182849 A1    Jun. 28, 2018

(30) Foreign Application Priority Data

Dec. 23, 2016    (EP) .................................... 16206532

(51) Int. Cl.
*H01L 29/06*    (2006.01)
*H01L 29/423*    (2006.01)
(Continued)

(52) U.S. Cl.
CPC .... *H01L 29/0676* (2013.01); *H01L 21/02107* (2013.01); *H01L 29/408* (2013.01);
(Continued)

(58) Field of Classification Search
CPC ............. H01L 29/0676; H01L 29/7827; H01L 29/4232; H01L 29/66666; H01L 29/408;
(Continued)

(56) References Cited

U.S. PATENT DOCUMENTS 8,063,450 B2    11/2011    Wernersson et al.
8,203,181 B2    6/2012    Hirler
(Continued)

FOREIGN PATENT DOCUMENTS

EP    2 887 398    6/2015

OTHER PUBLICATIONS

Deb et al., "Work Function Engineering With Linearly Graded Binary Metal Alloy Gate Electrode for Short-Channel SOI MOSFET", IEEE Transactions on Mamotechnology, vol. 11, No. 3, May 2012, pp. 472-478.

(Continued)

*Primary Examiner* — Victor A Mandala
(74) *Attorney, Agent, or Firm* — Knobbe, Martens, Olson & Bear LLP

(57) ABSTRACT

The disclosed technology relates generally to semiconductor devices, and more particularly to field-effect transistors (FETs) comprising nanostructures, such as nanowires, fins, and two dimensional materials. In an aspect, a FET device comprises a substrate having an insulating surface and a vertical structure extending in a direction substantially perpendicular to the insulating surface, where the vertical structure has at least outer surfaces formed of an insulating material. The FET device additionally includes a thin layer of two-dimensional (2D) material enveloping the vertical structure and at least part of the insulating surface. The FET device additionally includes two electrodes in electrical contact with the thin layer of 2D material, where one of the electrodes is formed on top of the vertical structure. The FET device additionally includes a control electrode configured to apply an electric field across the thin layer of 2D material to cause a change in the conductivity of the thin layer of 2D material. The FET device further includes at least one stack of materials configured to provide different regions of band bending in the thin layer of 2D material by capacitive coupling.

16 Claims, 3 Drawing Sheets

(51) Int. Cl.
*H01L 21/02* (2006.01)
*H01L 29/40* (2006.01)
*H01L 29/66* (2006.01)
*H01L 29/78* (2006.01)

(52) U.S. Cl.
CPC .... *H01L 29/4232* (2013.01); *H01L 29/42316* (2013.01); *H01L 29/66666* (2013.01); *H01L 29/7827* (2013.01); *H01L 29/0649* (2013.01)

(58) Field of Classification Search
CPC ......... H01L 21/02107; H01L 29/42316; H01L 29/0649; H01L 29/785; H01L 29/78; H01L 29/41775; H01L 29/1033
See application file for complete search history.

(56) References Cited

U.S. PATENT DOCUMENTS

| | | |
|---|---|---|
| 8,362,550 B2 | 1/2013 | Rexer et al. |
| 8,513,653 B2 | 8/2013 | Woo et al. |
| 8,735,240 B2 | 5/2014 | Kelwing et al. |
| 8,748,880 B2 | 6/2014 | Yamazaki et al. |
| 9,240,478 B2 | 1/2016 | Chang et al. |
| 9,269,775 B2 | 2/2016 | Choi et al. |
| 9,318,583 B2 | 4/2016 | Verhulst et al. |
| 9,391,091 B2 | 7/2016 | Cheng et al. |
| 9,406,872 B1 | 8/2016 | Annunziata et al. |
| 2015/0364592 A1 | 12/2015 | van Dal et al. |
| 2016/0181429 A1 | 6/2016 | Colinge et al. |
| 2016/0190343 A1* | 6/2016 | Hou ................. H01L 29/78642 257/29 |
| 2016/0372588 A1* | 12/2016 | Mizuno ............... H01L 29/7787 |
| 2017/0033210 A1* | 2/2017 | Curatola ........... H01L 21/02381 |

OTHER PUBLICATIONS

Lu et al., "Novel Vertical Hetero- and Homo-Junction Tunnel Field-Effect Transistors Based on Multi-Layer 2D Crystals", 2D Materials, IOP Publishing, 2016; 6 pages.

Kumar et al., AIP Publishing LLC, "Modeling of a vertical tunneling graphene heterojunction field-effect transistor", (https://doi.org/10.1063/1.4737394) 2012 Copyright.

* cited by examiner

TWO DIMENSIONAL FIELD EFFECT TRANSISTORS

CROSS-REFERENCE TO RELATED APPLICATIONS

This application claims foreign priority to European Patent Application No. 16206532.0, filed Dec. 23, 2016, the content of which is incorporated by reference herein in its entirety.

BACKGROUND

Field

The disclosed technology relates generally to semiconductor devices, and more particularly to field-effect transistors (FETs) comprising nanostructures, such as nanowires, fins, and two dimensional materials.

Description of the Related Technology

One of major driving forces in electronics design and manufacturing includes scaling of transistor size and power, while minimizing potential downsides, such as loss of control of transistor currents, e.g., the channel current. Scaling down of transistors (e.g., metal-oxide-semiconductor (MOS) structures) poses a challenge to the semiconductor industry. Nanostructures such as nanowires (NW), fins, etc., can be used to form different transistor parts, such as channel, source and drain regions and gates. Some FETs, e.g., fin field-effect transistors (FinFETs) and nanowire field-effect transistors (NWFETs), can be applied in single gate and multi gate configurations in a broad spectrum of applications. It is desirable to provide very thin layers and structures. Some materials, known as two-dimensional (2D) materials, show a set of physical properties arising from their electronic structure, from the type of molecular bonding and more importantly, from a layered topology, in which a single layer of molecules or atoms may be sufficient to provide a conductive path in an electronic device or circuit. For example, some crystalline carbon layers such as graphene show semimetal properties. This technology enables the control of atomic layers, and nanotransistors can be obtained.

For various applications, different regions of a transistor may be doped to modulate their conductivity. However, it is difficult to controllably dope 2D materials. Some properties of the 2D materials that distinguish the 2D materials from bulk materials are closely related to their structure, and any change of structure, by introduction of impurities, or vacancies, interfaces, etc., may strongly affect their properties. For example, some 2D materials may stop behaving like a 2D material, structural integrity of some 2D materials may be compromised, and diffusion processes are very difficult to control in some 2D materials. Hence, obtaining transistors using 2D materials is limited to very low doping levels. EP2887398A1 shows the possibility of manipulating to an extent some of the electronic properties (e.g., conductance) of graphene layers, specifically graphene bilayers. This creates a controllable "electric" doping on the layers. However, at least two gate electrodes are required to polarize the structure, thus increasing the number of gates and power sources. Thus, there is a need for an easily integrable standardized transistor with the advantages of nano-devices.

SUMMARY OF CERTAIN INVENTIVE ASPECTS

It is an object of embodiments of the disclosed technology to provide a device suitable for Field Emission Transistors with good controllability of doping levels in the channel, within the micro- or nanotechnology field, highly integrable and providing low power consumption.

In a first aspect, embodiments of the disclosed technology relate to a FET device comprising a substrate having an insulating surface, a structure substantially perpendicular to the insulating surface of the substrate, made from or covered by insulating material, a thin layer consisting of 2D material enveloping the substantially perpendicular structure and at least part of the insulating surface of the substrate, two electrodes in electric contact with the thin layer of 2D material, one of the electrodes being on top of the vertical structure, a control electrode arranged to apply an electric field across the thin layer of 2D material thereby inducing changes in the conductivity thereof. The FET of the disclosed technology further comprises at least one stack of materials which provide different regions of band bending in the thin layer of 2D material by capacitive coupling.

It is an advantage of embodiments of the disclosed technology that different regions of doping can be electrically induced in the thin layer, by means of the stack of materials, which provides electrical doping in the thin layer of 2D material, upon polarization of the control electrode.

In some embodiments of the disclosed technology, the at least one stack of materials comprises metallic materials with different work functions.

It is an advantage of embodiments of the disclosed technology that a stack comprising metallic materials is easy to obtain and control, e.g., via a deposition process.

In alternative embodiments of the disclosed technology, the at least one stack of materials comprises semiconductor materials with different doping levels.

It is an advantage of embodiments of the disclosed technology that standard semiconductor doping processing can be used.

In some embodiments of the disclosed technology, the at least one stack of materials is comprised inside the vertical structure, the stack of materials being isolated from the thin layer at least by the insulating layer covering the vertical structure.

It is an advantage of embodiments of the disclosed technology that a highly integrated and compact nanotransistor can be obtained.

In some embodiments of the disclosed technology, the at least one stack of materials is provided adjacent to the perpendicular structure, further comprising a dielectric layer between the at least one stack of materials and the thin layer enveloping the perpendicular structure.

In some embodiments of the disclosed technology, the control electrode is in electrical contact with the stack, e.g., in direct electrical contact, for directly biasing the stack.

In some embodiments of the disclosed technology, the control electrode comprises a gate stack of a gate dielectric and a gate electrode, the gate contact being isolated from the thin layer by at least the gate dielectric.

It is an advantage of embodiments of the disclosed technology that electric doping can be easily controlled with a standard gate stack, e.g., an all-around gate.

In some embodiments of the disclosed technology, the control electrode may be provided for example on the surface of the substrate, the control electrode not being in electrical contact with the thin layer.

In some embodiments of the disclosed technology, the thin layer consisting of 2D material is a layer of metal dichalcogenide material.

In a second aspect, the disclosed technology relates to a method of fabrication of a FET device, the method comprising obtaining a substrate having an insulating surface, providing a structure on the substrate, the structure being substantially perpendicular to the insulating surface, made from or covered by insulating material, enveloping the substantially perpendicular structure and covering at least the top and part of the substrate with a thin layer consisting of 2D material, providing a first electrode on the thin layer remote from the perpendicular structure and a second electrode on the thin layer on top of the perpendicular structure, providing a control electrode arranged to apply an electric field across the thin layer of 2D material for inducing changes in the conductivity thereof, and providing at least one stack of materials which provide different regions of band bending in the thin layer of 2D material by capacitive coupling upon polarization of the control electrode.

It is an advantage of embodiments of the disclosed technology that a nano-FET with 2D materials can be obtained with no need to use chemical doping on the 2D material.

In some embodiments of the disclosed technology, providing at least one stack comprises providing the stack embedded in the substantially perpendicular structure.

It is an advantage of embodiments of the disclosed technology that a stack of different materials may be obtained in a simple way, e.g., by stacking three layers of metals, or by providing different doping levels and/or dopants to layers of semiconductor material.

In some embodiments of the disclosed technology, providing at least one stack comprises providing the at least one stack of materials surrounding the substantially perpendicular structure, insulated therefrom by means of a dielectric layer.

It is an advantage of embodiments of the disclosed technology that the vertical structure can be directly obtained in a substrate surface, for example on an oxide surface.

In some embodiments of the disclosed technology, providing a control electrode comprises providing a gate stack comprising a gate dielectric and a gate electrode.

It is an advantage of embodiments of the disclosed technology that well-known methods of gate fabrication can be used.

In some embodiments of the disclosed technology, a conductive layer in contact with the at least one stack is provided, for providing electric contact between the control electrode in contact with the conductive layer and the stack, the control electrode being insulated from the thin layer of 2D materials.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
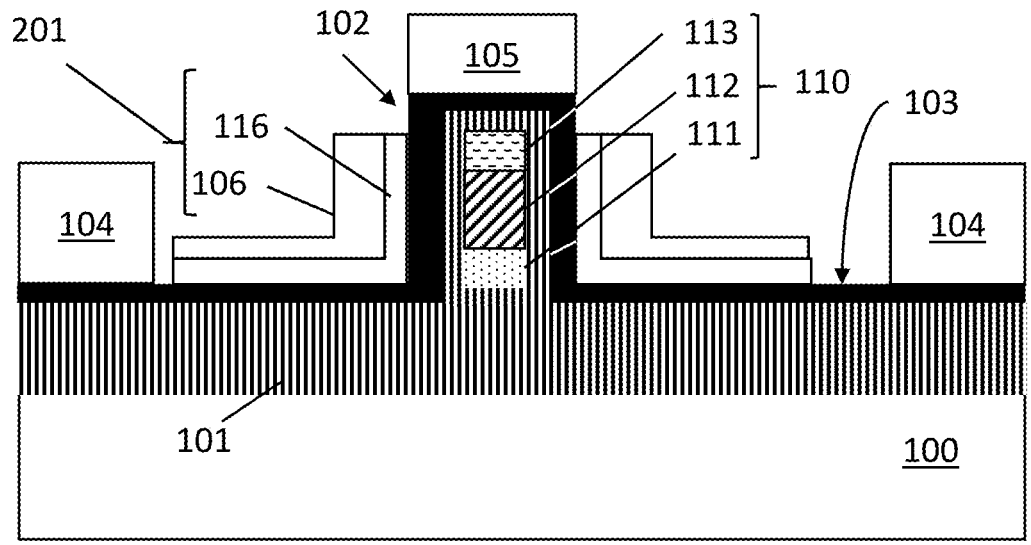
FIG. 1 illustrates a FET device according to an embodiment of the disclosed technology, comprising an internal stack of materials having a different metal work function.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where, in embodiments of the disclosed technology, a reference is made to "electric doping," reference is made to the changes of conductivity characteristic of some materials (e.g., 2D materials) upon application of an electric field through them.

Where in embodiments of the reference is made to "2D materials," reference is made to crystalline materials with a thickness corresponding to a few atomic layers, e.g., not more than 20 atomic layers, not more than 10 atomic layers, not more than 5 atomic layers, one atomic layer (monolayer), or a thickness corresponding to a number of atomic layers in a range defined by any of these values. These materials can present some physical properties of materials that are different or more enhanced than the properties of similar or same materials in bulk. The 2D materials are usually provided in the form of a "thin layer," a term which in embodiments of the disclosed technology refers to a layer with limited thickness, e.g., a thickness corresponding to 20 atomic layers or less, 10 atomic layers or less, 5 atomic layers or less, one atomic monolayer, or a number of atomic layers in a range defined by any of these values. Some 2D materials which can be used in the disclosed technology may be formed of compounds that can be represented as $MX_y$, e.g., $MX_2$ (e.g., a chalcogenide such as a transition metal dichalcogenide forming a molecular monolayer), where M is a metal element and y is about 1 or greater. In some embodiments, X is a nonmetal element.

In embodiments of the disclosed technology, the term "substrate" may include any underlying material or materials that may be used, and upon which a perpendicular structure may be formed. In particular embodiments, this substrate may be an insulating substrate. In alternative embodiments, the substrate may comprise a semiconductor substrate such as e.g., a silicon substrate, a gallium arsenide (GaAs) substrate, a gallium arsenide phosphide (GaAsP) substrate, an indium phosphide (InP) substrate, a germanium (Ge) substrate, or a silicon germanium (SiGe) substrate, provided with an insulating layer at its main surface. The substrate may include, for example, an insulating layer such as a $SiO_2$ or a $Si_3N_4$ layer, which can be formed on a surface or be embedded, in addition to a semiconductor substrate portion. Thus, the term substrate may refer to various silicon-on-insulator (SOI) technologies, e.g., silicon-on-glass or silicon-on sapphire substrates. The term "substrate" is thus used to define generally the elements for layers that underlie portions of interest. Also, the "substrate" may be any other base on which a layer is formed, for example a glass or metal layer. In the disclosed technology, the substrate has an insulating top layer. A particular example of such insulating layer is an oxide which may be provided on the main surface of the substrate (e.g., silicon oxide, aluminum oxide, other oxides, a combination thereof, etc.), which can be easily obtained and processed in well-known and optimized manufacturing routes.

In a first aspect, the disclosed technology relates to a FET device. The FET device comprises a substrate having a main insulating surface. For example, the substrate may be insulating itself, or an insulating or conductive substrate layer, or may be covered by an insulating layer, e.g., a dielectric. A structure is provided, substantially perpendicular to the main insulating surface of the substrate, for instance a vertical structure if the main surface of the substrate lies in a horizontal plane. The structure also comprises an insulating surface, for example it may be made from insulating material, or it may also be covered by an insulating layer, at its top and side walls. Depending on embodiments of the disclosed technology, the substantially perpendicular structure may be made from the insulating material covering the main surface of the substrate, or, at least partially, from material of a layer of the substrate.

A thin layer (one atomic layer or at most a couple of atomic layers, e.g., not more than 20 atomic layers, or not more than 10 atomic layers, preferably not more than 5 atomic layers thick) of a 2D material envelops the vertical structure and at least part of the surface of the substrate. The FET device further comprises a first electrode in electric contact with the 2D material on top of the substantially perpendicular, e.g., vertical, structure and at least one second electrode in electric contact with the 2D material covering the substrate aside the substantially perpendicular, e.g., vertical, structure.

Furthermore, a control electrode is provided adjacent the substantially perpendicular structure. The control electrode is arranged to apply an electric field across the thin layer of 2D material, for inducing changes in the conductivity thereof. The control electrode may be a gate stack comprising a gate electrode which, when suitably actuated, may control the transfer of charges between the first and the at least one second electrodes. The gate electrode, upon applying a potential, may generate an electric field in the 2D material, for example across the thin layer, which induces changes in the conductivity of the 2D material.

In accordance with the disclosed technology, a stack of materials is added to the FET device, at the inner and/or the outer side of the substantially perpendicular structure. The stack comprises materials which, upon polarization of the control electrode, provide, by capacitive coupling, different regions of band bending in the thin layer of 2D material. In embodiments of the disclosed technology, the stack may comprise a plurality of sheets, foils, blocks or in general parts. The stack may comprise materials with different metal work function, stacked adjacent to, or on top of, each other. In combination with the electric field applied by biasing the control electrode, those areas of 2D material overlapping with each of the different materials of the stack will present different changes in the conductivity in that specific area, thereby effectively inducing electric doping. In alternative embodiments, the stack may be a stack of semiconductors with different doping levels, inducing the same effect in the layer of 2D material. Hereto, the doping levels of the stack of semiconductors should be sufficiently high, so that degenerate semiconductor materials are formed, i.e. semiconductor materials with such a high level of doping that the material starts to act more like a metal than as a semiconductor.

Thus, a region with equivalent conductivity as a doped source can be obtained in the layer of 2D material, and a source can be induced therein. Analogously, a channel and a drain can be induced in the layer of 2D material by electrostatic doping, by a proper choice of materials in the stack. It is an advantage that at least three different electrically doped areas can be obtained in the layer of 2D material by the combination of a unique voltage (gate voltage) with a plurality of materials in the stack, thus reducing the transistor size.

Aside of reducing transistor size, another advantage of the use of 2D materials is that a 2D material can be directly provided as a part of a BEOL process. While in case of chemically doped materials, activation of the (chemical) doping usually requires a high thermal budget, there is no such an issue with 2D materials.

In a second aspect, the disclosed technology relates to a method of fabricating a FET device according to embodiments of the disclosed technology. The method comprises obtaining a substrate with an insulating surface, e.g., an insulating substrate, or a conductive or non-conductive substrate covered by an insulating layer on a main surface thereof, and providing a structure extending in a direction substantially perpendicular to the main surface of the substrate, where the structure may be formed of an insulating material or layer, or covered by an insulating material or layer. The substantially perpendicular structure may be obtained from the substrate, for instance from the material of the insulating surface layer, or by providing metal or semiconductor stacks and forming an insulating layer on its external surface. A limited number of atomic layers (e.g., a monolayer, a few layers, such as for instance not more than 5 or 10 or 20 layers or any number of monolayers in range defined by any of these values) of a 2D material is provided or formed, e.g., deposited, on the substrate and on the vertical structure. A first electrode is provided at the top of the substantially perpendicular structure, and at least one second electrode is provided at a first side of the substantially perpendicular structure, e.g., on a part of the 2D material covering the substrate adjacent to the perpendicular structure, for providing electrical connections to the thin layer of 2D material. A control electrode is provided, arranged to apply an electric field across the thin layer of 2D material, for inducing changes in the conductivity thereof. Furthermore, at least one stack of materials is provided, which provides, upon polarization of the control electrode, by capacitive coupling, different regions of band bending in the thin layer of 2D material.

In embodiments of the disclosed technology, a structure is provided which is substantially perpendicular to the main surface of the substrate. The substantially perpendicular structure may be obtained from the same material as the substrate, or from the same material as the insulating layer over the substrate, e.g., via etching, or deposition, etc. In embodiments of the disclosed technology, the substantially perpendicular structure comprises insulating material on its surface (top and side walls), e.g., oxide material. The insulating layer over the substantially perpendicular structure may comprise the same material as the insulating layer covering the substrate surface, which is advantageous because both can be provided simultaneously (e.g., with a same deposition or oxidation step). The substantially perpendicular structure may be a vertical structure, if the substrate is oriented in a horizontal plane. The substantially perpendicular structure may be a nanowire (NW), a thin wall or a thin fin, the disclosed technology not being limited thereto. In some embodiments, the substantially perpendicular structure comprises a core material formed of the same material as the substrate, e.g., an extension of the substrate, that is covered by an insulating layer (e.g., the oxide of the substrate surface).

Some or all of the external walls of the vertical structure and at least part of the surface substrate are covered by a thin layer of 2D material. The disclosed technology provides ways of defining different parts of a transistor in this thin layer. The thin layer may comprise any suitable 2D conductive material. For example, the thin layer may comprise carbon, forming e.g., a graphene layer. The disclosed technology is not limited to 2D materials comprising carbon, and other materials such as metal-nonmetal compound, e.g., chalcogenides such as transition metal dichalcogenides (TMD) (e.g., $MoS_2$, MoSe, $WS_2$, $WSe_2$, etc.), can be used. The disclosed technology is not limited to 2D TMDs, and other materials such as MX-enes (graphene, silicene, etc), X-anes (e.g., graphene, silicane, etc) can be used. The thin layer may comprise e.g., a monolayer or a few monolayers of 2D materials.

In embodiments of the disclosed technology, the 2D materials and manufacturing conditions (e.g., deposition parameters) are selected depending on the underlying substrate, for example depending on the composition of the substrate surface or of the insulating layer on top thereof, which may be a dedicated insulating layer; or depending on circuit elements already present on or in the substrate, and for instance on the thermal budget they can withstand. This can facilitate the process of applying the layer on top of the insulating surface of the substrate, ensure adhesion between the deposited layer and the surface of the substrate, and maintain good electric properties of the deposited layer and good insulation on the insulating surface of the substrate.

In embodiments of the disclosed technology, the 2D layer is in electric contact with a set of electrodes. These electrodes may be formed by suitable conductive material, preferably with good compatibility with the 2D materials of the thin layer and provide connection to a circuit, e.g., to an integrated circuit, e.g., via a further metallization layer, micro-ball bumps, solder balls, electrodes, etc. At least two electrodes are provided, a first one on top of the substantially perpendicular structure and a second one on part of the 2D layer covering the substrate. These at least two electrodes will function as source and drain electrodes, respectively.

In embodiments of the disclosed technology, a control electrode is provided. The control electrode may be a gate electrode isolated from the thin layer of 2D material by a gate dielectric, the gate dielectric and the gate electrode together forming a gate stack. The control electrode (which may comprise any suitable material known for control electrodes, e.g., gate electrodes) can be used to generate an electric field across the thin layer of 2D material, either solely on the substantially perpendicular structure, or both on parts of the thin layer of 2D material on the substantially perpendicular structure and on part of the substrate. This electric field affects the conductivity of the thin layer where the gate stack is present. For example, introducing an electric field across the thin layer can have the same effect on the conductivity of the thin layer as introducing dopant atoms. The control electrode may be provided on the surface of the substrate, but isolated from the thin layer of 2D material, and/or it may be provided with an insulating layer (e.g., a gate oxide) on the external walls of the fin or nanowire, or around the nanowire in a "gate-all-around" configuration.

In embodiments of the disclosed technology, a stack of materials is provided, which provides different regions of band bending in the thin layer of 2D material, upon polarization of the control electrode. Hereto, the materials in the stack have different electronic properties. The stack of materials may be provided in and/or around the substantially perpendicular structure. For example, a stack of three metals with different work functions can be provided. In combination with the electric field applied by the control electrode, each of the materials of the stack will provide different response on the adjacent thin layer enveloping the vertical structure. The different work functions of the materials in the stack cause the zones next to each of these materials to present a different band gap opening, thus providing three different electric doping regions. For example, the region of the thin layer overlapping a first metal of the stack may have an N-type electric doping, thus acting as a source region. The region of the thin layer overlapping the middle material of the stack may act as an intrinsic region (suitable as a channel), and finally a drain region can be electrically induced in the region of the thin layer overlapping the third material of the stack. For example, if the third material of the stack is adjacent to the top of the vertical structure, the drain is formed on top of said structure, and the electrode formed thereon becomes the drain electrode. Although three stacked layers have been explained, other configurations can be used. For example, four or more, or less than three materials in the stack can be also provided. The materials in the stack may be any suitable materials which provide different regions of band bending in the thin layer of 2D material upon polarization of the control electrode, such as for instance metals with different work functions, semiconductors with different electron affinity, or a combination thereof.

The control electrode may be directly in contact with the stack. The stack can be provided outside the substantially perpendicular structure, isolated from the 2D material on its surface by e.g., an oxide or a different insulating layer. The stack is oriented with respect to the substantially perpendicular structure so that each of the materials of the stack can introduce a predetermined field in different areas of the nanostructure, more particularly in the layer of 2D material thereon. For example, an interface between two adjacent materials of the stack may be substantially perpendicular to a surface of the substantially perpendicular structure. For example, in a vertical nanowire, each material of the stack may surround the nanowire horizontally at different heights thereof.

In other embodiments, the stack may be provided inside the substantially perpendicular structure, embedded or buried therein. This way, the stack is isolated from the thin layer of 2D material, because the 2D material is provided over the insulating surface of the substantially perpendicular structure. Contact between the control electrode and the stack can be provided, for example the control electrode may be provided on the substrate, and a metallization layer under the insulating layer on the substrate may contact the control electrode and the stack inside the substantially perpendicular structure. The disclosed technology is not limited to metallization layers, and any other conductive means (e.g., doped semiconductors) can be used. The control electrode is isolated from the thin layer of 2D material on the substrate, e.g., by a surrounding insulator, or by providing the control electrode in a zone of the substrate surface devoid of 2D material, through the insulating layer, to a metallization layer buried within. Thus, the control electrode and the stack are isolated from the thin layer of 2D material, and no oxide or other dielectric material needs to be introduced.

Any further electrode may be provided on the substrate, distant from the first electrode. For example, in the case the substantially perpendicular structure is a fin, the first and further electrodes may be separated by the fin, both acting as sources, while the electrode on top of the fin may act as a drain.

In the following, reference is made to a vertical structure as the substantially perpendicular structure, without being limiting for the disclosed technology.

FIG. 1 shows a cross-sectional view of a FET device according to a first embodiment of the disclosed technology. The FET device comprises a substrate 100 having an insulating layer 101, e.g., an oxide layer on its top surface, either as part of the substrate or deposited thereon. The substrate 100, in the embodiments illustrated, has a major surface that is oriented in a horizontal plane. A vertical structure 102, for example a NW, is provided on the substrate 100, for example on the insulating layer 101, e.g., an oxide layer. The insulating layer 101 and the vertical structure 102 are covered at least partially. In the example illustrated for example, the insulating layer 101 and the vertical structure 102 are both completely, by a thin layer 103 of a 2D material. One or more, e.g., two, electrodes 104 can be provided on the surface of the substrate 100, which serve as one of the terminals of the transistor (e.g., one of a source electrode and a drain electrode). A further electrode 105, which can be formed on top of the vertical structure 102, serves as the other terminal of the transistor (e.g., the other of the source electrode or the drain electrode). The gate electrode 106 is provided at least along the external walls of the vertical structure 102, electrically isolated from the thin layer 103 of the walls by a gate insulator 116, for instance a gate oxide. The gate electrode 106 and gate insulator 116 can also extend over the thin layer 103 on the substrate, as shown in FIG. 1, but this is not the only possibility, and the gate insulator and/or gate electrode can be provided only along the side wall of the vertical structure. For example, the gate (comprising an electrode and an insulator) can be a ring surrounding a vertical nanowire, or it can be placed along at least part of the walls of a fin, forming a fin sandwich.

Inside the vertical structure 102, a stack 110 is provided, in the embodiment illustrated comprising three conductive parts or layers 111, 112, 113, e.g., metal parts or layers. The different conductive parts or layers 111, 112, 113, e.g., metal parts or layers, are formed of different materials having different work functions. Without being bound to any theory, when different metal layers having different work functions are formed on the same 2D material, an electric field applied on the 2D material may cause different amounts of changes to certain electronic structures of the 2D material, e.g., different amounts of bending of electronic bands such as conduction or valence bands. In the illustrated embodiment, an electric field (which can be generated by an electrical signal, e.g., a voltage, applied to the gate electrode), combined with the stack, induces different electrostatic doping, or different amounts of band bending, on different regions of the thin layer of 2D material overlapping the different conductive parts or layers 111, 112, 113 in the stack 110, due to the different work functions (WF) of each metal. Different areas of the thin layer of 2D material can form, due to the different electrostatic doping, a drain region, and the electrode 105 serves as a drain electrode. Analogously, a channel region and a source region (in contact with the source electrodes 104) are formed by electric doping, in the areas overlapping the other two stacked parts or layers 112, 111, respectively. However, the disclosed technology is not limited to a stack of metals, and any other stack of materials which provide different regions of band bending in the thin layer of 2D material can be used.

In some embodiments, the stack of materials providing band bending may comprise three different conductive materials (e.g., metals, conductive oxides, etc.) in electrical contact. This improves control of the band bending. The stack 110 may be an electrically floating stack, as shown in FIG. 1. That is, the stack 110 may be enveloped by the insulating layer 101 such that no electrical connection is made thereto. In other embodiments, while the three materials are also in electric contact, the material in the middle of the stack may be dielectric, and electric contact between the parts separated by the dielectric may be provided by a small conductive line between the other materials in the stack, for example the line may be provided inside the dielectric material.

Figure 2:
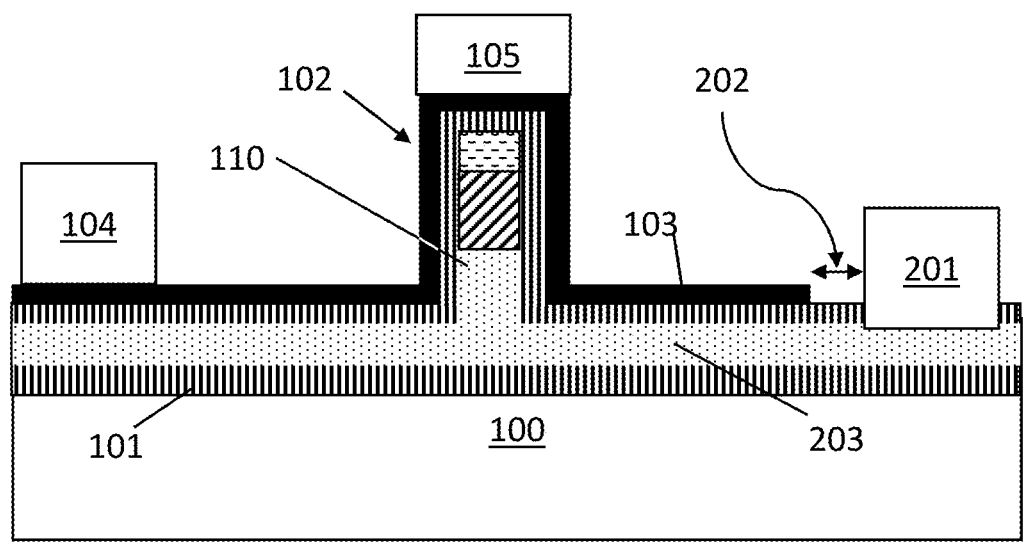
FIG. 2 illustrates a FET device according to a different embodiment of the disclosed technology, also comprising an internal stack of materials having a different metal work function.

FIG. 2 shows a cross sectional view of a FET device comprising a single source electrode 104, a single drain electrode 105 on top of the vertical structure 102, where both electrodes are directly provided on the layer 103 of 2D material, in a similar manner as described above with respect to the FET device of FIG. 1. Unlike the FET device of FIG. 1, however, in FIG. 2, a gate electrode 201 is in electrical contact with the metal stack 110 embedded within the vertical structure 102 through a conductive layer 203. The gate electrode 201 is isolated from the thin layer of 2D material 103, for example by a gap 202, obtaining an area on the substrate in which the thin layer of 2D material is not provided (e.g., it may have been removed or not deposited there). Additionally or alternatively, an insulating material may be included in lieu of or in the gap for avoiding contact between the thin layer 103 and the gate electrode 201. Thus, a gate oxide is not needed in this particular embodiment, although it can additionally be provided. The first metal of the stack, closer to the substrate, may be extended or connected to a conductive layer 203 (e.g., a metallic layer) buried in the oxide 101, isolated from the thin layer of 2D material 103, and connected to the gate electrode 201. The conductive layer 203 may be made of the same material as one of the layers of the stack. It also may participate in the electric doping of the thin layer of 2D material overlapping the conductive layer 203.

The band bending of the thin layer of 2D material can be induced by suitable configurations of the adjacent materials in the stack according to various embodiments disclosed herein including, for example, forming a direct electrical contact between each of the three materials in the stack. In FIG. 2, the stack is directly biased by the control electrode 201 in electrical contact with the conductive layer 203. In cases of direct bias, there is no need of direct electric contact between each of the stacked materials in order to obtain biasing of the three materials in the stack. This can be provided even if the material in the middle of the stack is a dielectric and no conductive line is present between the first and second materials in the stack, as long as sufficient electrostatic coupling is provided between these materials, for example by providing a dielectric middle material with a thickness such that electrostatic coupling is allowed between the first and third materials.

Figure 3:
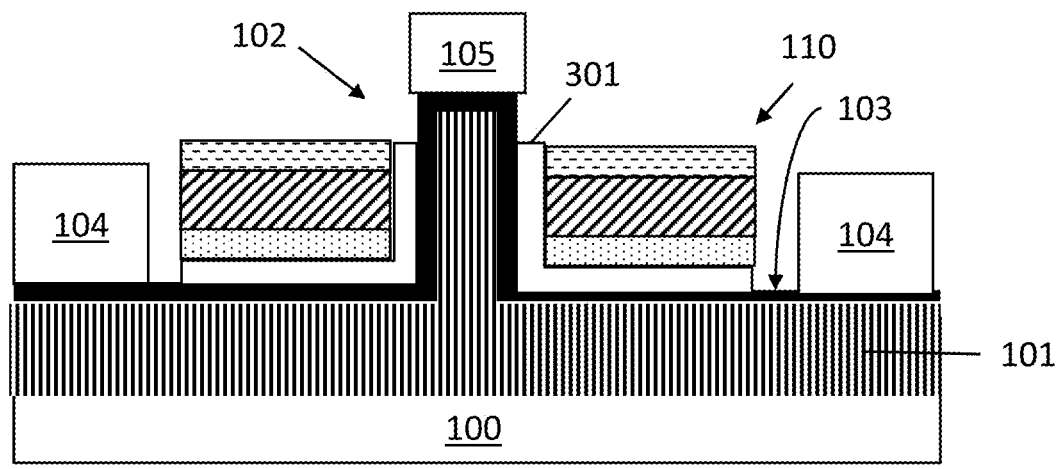
FIG. 3 illustrates an embodiment of a FET device comprising an external stack.

FIG. 3 shows a cross sectional view of a FET device according to embodiments of the disclosed technology in which the stack 110 is not embedded in the vertical structure 102, but is located outside of it. In this particular embodiment, the contact between the control electrode 104 and the stack 110 may be made directly, with no need of metallization layer or further electrode. Each of the materials of the stack 110 have a different electron affinity (e.g., in case of semiconductors) or a different work function (in case of metals). Each part or layer in the stack 110 is disposed to provide different regions of band bending to different areas of the thin layer of 2D material on the vertical structure 102; however, the stack may be isolated from the 2D material, for example by an insulating layer 301 (which may be a gate oxide) provided between the stack 110 and the thin layer of 2D material covering the vertical structure 102, and may optionally additionally be present between the stack 110 and the substrate 100, as shown in FIG. 3. An exemplary embodiment may present a NW surrounded by a toroidal stack of three different materials, the interface between two adjacent materials material being substantially perpendicular to the thin layer of 2D material 103 covering the vertical structure.

Figure 4A:
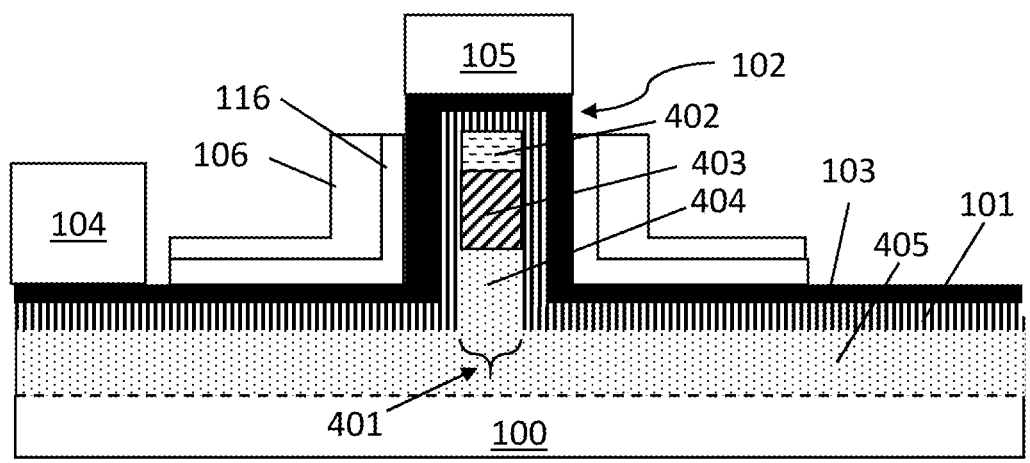
FIG. 4(a) and FIG. 4(b) show two alternative embodiments with a stack comprising semiconductors.
Figure 4B:
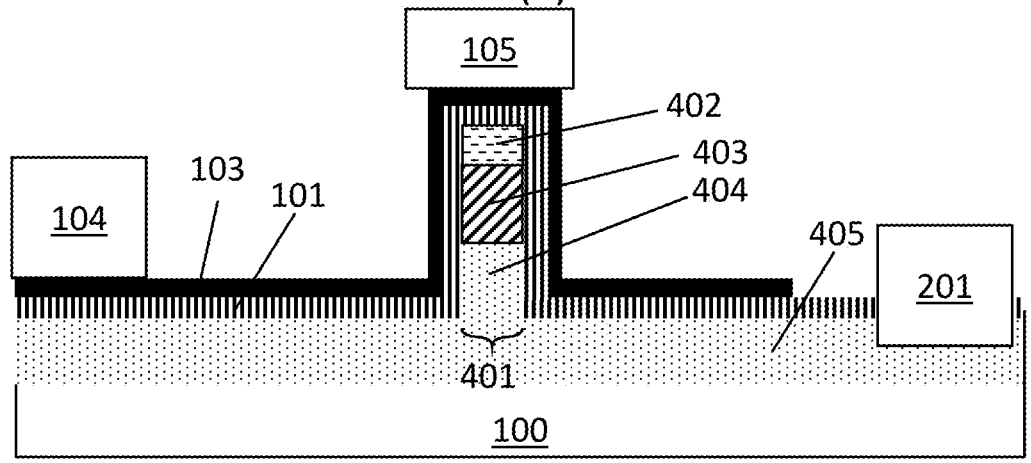

FIG. 4 shows two alternative embodiments of FET devices, corresponding to the FET devices shown in FIG. 1 and FIG. 2, wherein the stack 110 comprises, rather than metals with different work functions, semiconductors with different electronic affinities. In this case, each part or layer of the stack may comprise the same semiconductor material, but with different dopants and/or different doping levels; however, the disclosed technology is not limited thereto and different semiconducting materials can also be used. Still in other embodiments, combinations of semiconductors and metals may also be used. In FIG. 4(*a*), a gate electrode 106 and gate oxide 116 surround the vertical structure 102, and a semiconductor stack 401 is buried within the vertical structure 102. The semiconductor stack 401 illustrated comprises three regions of semiconductor material, with different doping levels, for instance $N^{++}$ doping in the top region 402 of the stack 401, an intrinsic region 403 in the middle of the stack 401, and again $N^{++}$ doping in the bottom region 404. When biasing the gate electrode 106 with a suitable electrical signal, the three regions 402, 403, 404 in the stack 401 provide different electric doping at different heights of the thin layer 103 over the structure 102. The bottom region 404 closest to the substrate 100 may extend under the insulating layer 101 of the substrate 100. The extension layer 405 may be even in contact with or be a part of the substrate 100. The extension layer 405 may, for example, be obtained by doping, and this doping may for instance be performed simultaneously with the doping of the bottom region 404 of the vertical structure 102 provided on the surface 100, before providing the insulating layer 101. This may provide additional electrical contact and more control over the electric field obtained, if needed. However, the extension layer 405 is not limited to a layer having the same properties as the bottom region 404 of the semiconductor stack 401. It may alternatively be a simple conductive layer, or it may comprise a different semiconductor material, or it may be a semiconductor comprising the same type of dopant as the bottom region 404, rendering an extension layer 405 with high conductivity.

FIG. 4(*b*) also illustrates presence of the extension layer 405 between the substrate 100 and the insulating layer 101, in contact with a gate electrode 201 in a similar fashion as the conductive layer 203 of FIG. 2. As before, the stack 401 is provided with a highly doped top region 402, an intrinsic middle region 403 and a highly doped bottom region 404. This stack 401 provides different electric doping in three different areas of the thin layer 103 upon biasing of the gate 201. In this case also, the extension layer 405 and the gate electrode 201 are isolated from the thin layer 103 of 2D material by means of the insulating layer 101.

The disclosed technology may be applied to traditional MOSFETs, thus allowing reducing the size of these transistors. Providing 2D materials present advantageously high conductivity in MOSFET structures. It can be applied also to TFETs, with similar advantages of e.g., scaling or conductivity. The materials in the stack may be selected each in order to induce a different electrostatic doping depending on the particular application and/or transistor. For example, in case of a MOSFET, a stack should be chosen so that a N-P-N or P-N-P type doping can be generated in the thin layer. In case of a TFET, the stack should be adapted so that a P-I-N type doping can be generated.

The disclosed technology can be applied to multi-gate structures.

In a second aspect of the disclosed technology, a method is provided for obtaining a FET device according to embodiments of the first aspect. In general terms, the method comprises obtaining a substrate (e.g., a glass, a semiconductor substrate, any suitable underlying layer either insulating or not), with an insulating surface. In a first variation, an insulating layer is provided on the substrate, for example by oxidation or by deposition. Optionally, a conductive layer can be provided between the remainder of the substrate and the insulating layer, for example by deposition of a conductive layer such as a metallization layer or by providing high doping level to a top layer or region of a semiconducting substrate, and then deposition of the insulating layer. Well-known semiconductor production routes can be used with a minimum number of connections and with high integrability, compact and small, suitable for nanotechnology (e.g., production of nanowires, FinFETs, etc.).

Figure 5A:
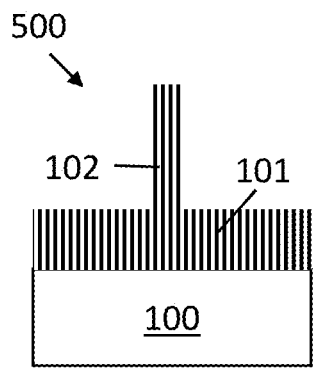
FIG. 5(a) to FIG. 5(c) illustrate intermediate structures at various stages of fabrication of a FET according to embodiments of the disclosed technology
Figure 5B:
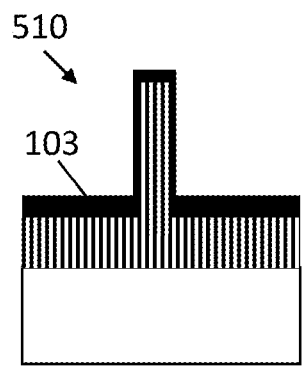
Figure 5C:
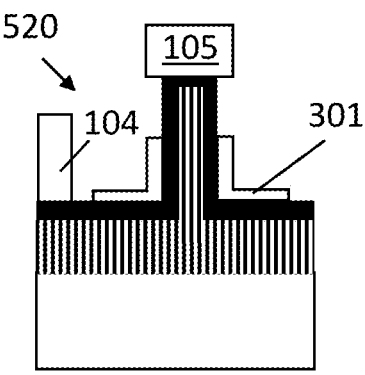
Figure 6A:
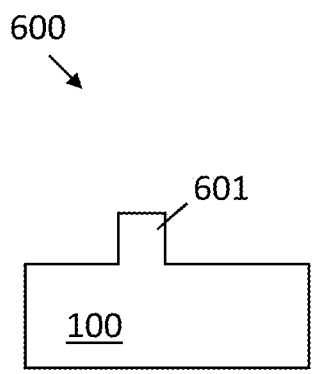
FIGS. 6(a) to 6(e) illustrate intermediate structures at various stages of fabrication of a FET according to alternative embodiments of the disclosed technology.
Figure 6B:
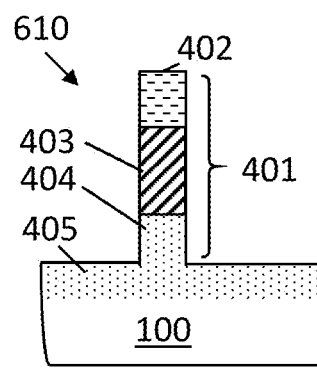
Figure 6C:
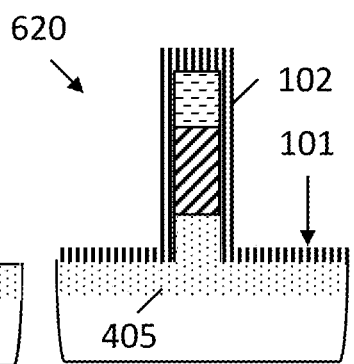
Figure 6D:
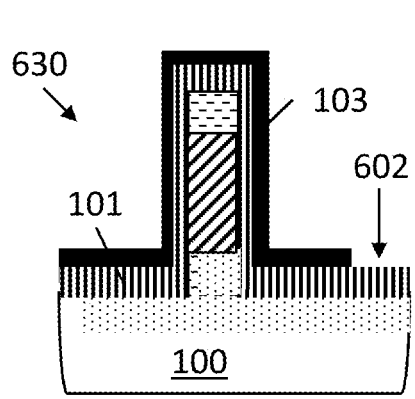
Figure 6E:
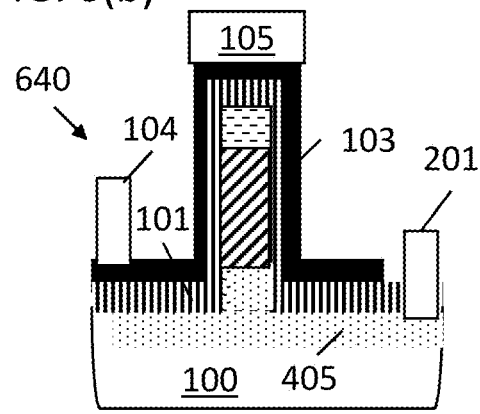

FIG. 5 shows three steps of obtaining a FET device according to embodiments of the disclosed technology. In a first step 500, illustrated in FIG. 5(a), the vertical structure 102 is provided on or in the insulating layer 101 covering the substrate 100. For example, it may be obtained by etching, deposition, growth, etc. In a second step 510, illustrated in FIG. 5(b), the thin layer 103 of 2D material is provided by providing a single atomic layer or few atomic layers, preferably not more than 10 or 20 atomic layers, even more preferred not more than 5 atomic layers, of a 2D material (for instance graphene, a metal dichalcogenide, etc.). This can be done by any suitable process, such as for instance by molecular beam epitaxy (MBE), by chemical vapor deposition (CVD) or by atomic layer deposition (ALD), optionally combined with MBE, etc. In a third step 520, illustrated in FIG. 5(c), electrodes 104, 105 are provided on the thin layer 103 of 2D material. These electrodes may function, during use of the device, as source and drain electrodes, respectively.

The above-mentioned particular methods of depositing 2D materials provide smaller thickness of 2D material (less layers) at the side surfaces of the vertical structure 102 than on horizontal surfaces. This has the additional advantage that the quality of the thin layer 103 of 2D material is high on the side surfaces of the vertical structure 102, and the higher thickness of the layer of 2D material on the substrate surface and on the top of the vertical structure provides a good contact resistance for the source and drain electrodes 104, 105.

Further, an insulating layer 301 may be provided around the vertical structure. Then (not illustrated in FIG. 5a-c), a stack of materials which, upon suitable biasing, provide different regions of band bending in the thin layer of 2D material (e.g., a metal stack, or a stack of semiconductor materials) can be provided, e.g., around the vertical structure 102, for example by deposition or other means such as deposition and patterning, local growth, etc. A control electrode can be provided isolated from the layer 103 of 2D material but in contact with the stack, thus obtaining the structure (e.g., fin, or NW) with a cross section shown in FIG. 3.

In alternative embodiments, the stack of materials which provide different regions of band bending in the thin layer of 2D material, e.g., a metal stack, could be provided on top of the flat insulating layer over the substrate. When this stack is covered with an insulating layer, a vertical structure as in FIG. 1 is obtained. This vertical structure 102 and possibly part of the main surface of the substrate are covered by a thin layer 103 of 2D material enveloping the vertical structure 102. A further insulating layer 116 around the vertical structure 102 can be a gate oxide, and finally a gate electrode 106 can be provided, obtaining the structure with cross section shown in FIG. 1.

The choice of materials forming the stack depends on the specific need, and can be adjusted in accordance to the electric field necessary to provide different electric doping on the different regions of thin layer 103.

FIG. 6 shows five steps of obtaining a FET device according to alternative embodiments of the disclosed technology. In a first step 600, illustrated in FIG. 6(a), the core 601 of a vertical structure is obtained directly on the substrate 100, from substrate material (e.g., via etching, growth, etc). Then, in a second step 610, illustrated in FIG. 6(b), a first semiconducting part or layer 404 of a stack 401 can be obtained by suitably doping the semiconductor material of the core 601. When both the substrate 100 and the core 601 are semiconductors, an extension layer 405 and the bottom semiconducting layer 404 of the semiconductor stack 401 can be advantageously obtained simultaneously, e.g., by doping. Different depositions at different heights of the nanostructure can be done by e.g., successive masking, CVD and/or MBE and etching processes, using different dopants and/or providing different dopant concentrations, thus obtaining stacked parts 404, 403, 402 of materials with different semiconducting properties. The type of dopant and dopant levels depend on the specific needs, and can be adjusted in accordance with the electric field required to provide different electric doping in different regions of the thin layer 103 of 2D material. For example, the doping of the top 402 and bottom layer 404 may comprise N+-type doping, or preferably N++-type doping at different levels, for example at degenerate levels in order to provide enough band bending in the adjacent zone of the 2D material layer (and optionally on the top material of the stack by electrostatic coupling), while the material in the middle layer 403 of the stack may comprise lower doping levels, e.g., intrinsic doping levels. Depending on the type of FET (pFET, nFET, TFET etc) different doping types can be used (p-n-p, n-p-n, p-i-n, etc). A further step 620, illustrated in FIG. 6(c), comprises providing an insulating layer 101 over the stack 401 of materials, thereby obtaining the vertical structure 102, and on top of the free main surface of substrate 100 (e.g., on top of the extension layer 405). The insulating layer 101 may cover the whole substrate, but it does not need to, and a portion thereof may remain uncovered, available for instance for a further electrode (e.g., gate electrode). Then, in step 630, illustrated in FIG. 6(d), a thin layer 103 comprising 2D materials is provided over the vertical structure 102 as before, thus enveloping the vertical structure 102 and covering at least part of the substrate surface. The thin layer 103 of 2D material may be provided on top of the insulating layer 101, optionally not providing 2D material on an area 602 which can be masked or somehow protected. Finally, in step 640, illustrated in FIG. 6, electrodes 104, 105 can be provided on top of the thin layer 103 of 2D material, on the substrate 100 and on top of the vertical structure 102, respectively. A gate electrode 201 can further be provided on the substrate 100, isolated from the thin layer 103 (e.g., by placing it in the area 602 free of 2D material, leaving a gap 202 between the layer 103 of 2D material and the gate electrode 201), through the insulating layer 101, providing electrical contact to the extension layer 405. A gate stack (gate electrode and gate dielectric) may alternatively also be provided at the sides of the vertical structure 102, as shown in FIG. 1, FIG. 3, and FIG. 4(a).

A final surface passivation layer can be added, for example a polymeric capping layer, e.g., water-soluble polyvinyl alcohol. The passivation layer may cover any exposed surface of the 2D material layer. For example, passivation may take place and then electrodes may be provided, e.g., by locally removing parts of the passivation layer. Alternatively, the electrodes may be provided before passivation, as long as the 2D layer is protected.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A field effect transistor (FET) device comprising:
a substrate having an insulating surface;
a vertical structure extending in a direction substantially perpendicular to the insulating surface, the vertical structure having at least portions of outer surfaces covered with an insulating material;
a thin layer of two-dimensional (2D) material enveloping the vertical structure and at least part of the insulating surface;
two electrodes in electrical contact with the thin layer of 2D material, wherein one of the electrodes is formed on top of the vertical structure;
a control electrode configured to apply an electric field across the thin layer of 2D material to cause a change in the conductivity of the thin layer of 2D material; and
at least one stack of materials configured to provide different regions of band bending in the thin layer of 2D material by capacitive coupling, wherein the at least one stack of materials comprises metallic materials having different work functions or semiconductor materials having different doping levels.

2. The FET device according to claim 1, wherein the at least one stack of materials is formed inside the vertical structure, the stack of materials being isolated from the thin layer of 2D material at least by the insulating material formed on outer surfaces of the vertical structure.

3. The FET device according to claim 1, wherein the at least one stack of materials is provided adjacent to the vertical structure, wherein the FET device further comprises a dielectric layer formed between the at least one stack of materials and the thin layer of 2D material.

4. The FET device according to claim 1, wherein the control electrode is in electrical contact with the at least one stack of materials.

5. The FET device according to claim 4, wherein the control electrode is provided on the insulating surface of the substrate, and wherein the control electrode is not in electrical contact with the thin layer of 2D material.

6. The FET device according to claim 1, wherein the control electrode comprises a gate stack comprising a gate dielectric and a gate electrode, wherein the gate electrode is electrically isolated from the thin layer of 2D material by at least the gate dielectric.

7. The FET device according to claim 1, wherein the thin layer of 2D material comprises a chalcogenide material.

8. The FET device according to claim 7, wherein the thin layer of 2D material has a thickness corresponding to 20 atomic layers or less of the chalcogenide material.

9. The FET device according to claim 7, wherein the chalcogenide material is a metal dichalcogenide material.

10. The FET device according to claim 7, wherein the thin layer of 2D material consists of the chalcogenide material.

11. The FET device according to claim 1, wherein the at least one stack of materials is electrically floating.

12. A method of fabrication of a field-effect transistor (FET) device, the method comprising
providing a substrate having an insulating surface;
providing a vertical structure on the substrate, the vertical structure extending in a direction substantially perpendicular to the insulating surface, the vertical structure having at least portions of outer surfaces covered by an insulating material;
enveloping the vertical structure and covering at least a top and part of the substrate with a thin layer of two-dimensional (2D) material;
providing a first electrode on the thin layer and spaced apart from the vertical structure;
providing a second electrode on the thin layer at the top of the vertical structure;
providing a control electrode configured for applying an electric field across the thin layer of 2D material to induce changes in the conductivity of the thin layer of 2D material; and
providing at least one stack of materials configured to provide different regions of band bending in the thin layer of 2D material by capacitive coupling upon polarization of the control electrode.

13. The method of claim 12, wherein providing the at least one stack comprises embedding the at least one stack in the vertical structure.

14. The method of claim 12, wherein providing the at least one stack comprises surrounding the vertical structure with the at least one stack, and further comprises electrically insulating the vertical structure and the at least one stack from each other with a dielectric layer interposed therebetween.

15. The method of claim 12, wherein providing the control electrode comprises providing a gate stack comprising a gate dielectric and a gate electrode.

16. The method of claim 12, further comprising providing a conductive layer in contact with the at least one stack, wherein providing the control electrode comprises electrically contacting the control electrode with the conductive layer, while electrically insulating the control electrode from the thin layer of 2D material.

* * * * *